(12) United States Patent
Jeon

(10) Patent No.: US 7,354,841 B2
(45) Date of Patent: Apr. 8, 2008

(54) METHOD FOR FABRICATING PHOTODIODE OF CMOS IMAGE SENSOR

(75) Inventor: In Gyun Jeon, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 300 days.

(21) Appl. No.: 11/176,721

(22) Filed: Jul. 6, 2005

(65) Prior Publication Data

US 2006/0008940 A1 Jan. 12, 2006

(30) Foreign Application Priority Data

Jul. 8, 2004 (KR) .................. 10-2004-0053041

(51) Int. Cl.
*H01L 21/331* (2006.01)

(52) U.S. Cl. .................. 438/374; 257/E21.135

(58) Field of Classification Search .................. 438/57, 438/286, 372–374; 257/E21.135
See application file for complete search history.

(56) References Cited

U.S. PATENT DOCUMENTS

| | | |
|---|---|---|
| 5,841,126 A | 11/1998 | Fossum et al. |
| 5,886,659 A | 3/1999 | Pain et al. |
| 5,990,506 A | 11/1999 | Fossum et al. |
| 6,005,619 A | 12/1999 | Fossum |
| 6,021,172 A | 2/2000 | Fossum et al. |
| 6,462,365 B1 | 10/2002 | He et al. |
| 6,531,725 B2 | 3/2003 | Lee et al. |
| 6,545,302 B2 | 4/2003 | Han |
| 6,713,796 B1 | 3/2004 | Fox |
| 6,781,169 B2 | 8/2004 | Roy |
| 6,849,886 B1 | 2/2005 | Han |
| 6,885,047 B2 | 4/2005 | Shinohara et al. |
| 7,015,521 B2 | 3/2006 | Koyama |
| 7,157,754 B2 * | 1/2007 | Nagasaki et al. ........... 257/219 |
| 7,205,627 B2 | 4/2007 | Adkisson et al. |
| 2004/0222449 A1 | 11/2004 | Koyama |
| 2004/0248373 A1 | 12/2004 | Park |
| 2005/0064620 A1 | 3/2005 | Han |
| 2005/0064665 A1 | 3/2005 | Han |
| 2005/0087783 A1 | 4/2005 | Jang |
| 2005/0088556 A1 | 4/2005 | Han |
| 2005/0093036 A1 | 5/2005 | Han |

FOREIGN PATENT DOCUMENTS

| | | |
|---|---|---|
| KR | 10-2002-0017739 | 3/2002 |
| KR | 10-2003-0037860 | 5/2003 |

OTHER PUBLICATIONS

Won Ho Lee; CMOS Image Sensor and Manufacturing Method Thereof; Korean Patent Abstracts; May 15, 2003; Pgs.; KIPO; Korea.
Se Jung Oh; Method for Forming Image Sensor Capable of Increasing Area of Photodetecting Surface; Korean Patent Abstracts; Mar. 7, 2002; 2 Pgs.; KIPO; Korea.

* cited by examiner

*Primary Examiner*—Michael Lebentritt
*Assistant Examiner*—Elias Ullah
(74) *Attorney, Agent, or Firm*—Andrew D. Fortney

(57) ABSTRACT

A method for fabricating a photodiode of a CMOS image sensor is disclosed, to improve a charge accumulation capacity in the photodiode, which includes the steps of defining a semiconductor substrate as an active area and a field area by forming an STI layer; firstly implanting impurity ions for formation of the photodiode to the semiconductor substrate of the active area; secondarily implanting impurity ions for formation of the photodiode to the semiconductor substrate being adjacent to the STI layer; and forming a photodiode ion-implantation diffusion layer by diffusing the implanted impurity ions with a thermal process.

9 Claims, 3 Drawing Sheets

METHOD FOR FABRICATING PHOTODIODE OF CMOS IMAGE SENSOR

CROSS-REFERENCE TO RELATED APPLICATIONS

This application claims the benefit of Korean Application No. P2004-53041 filed on Jul. 8, 2004, which is hereby incorporated by reference as if fully set forth herein.

BACKGROUND OF THE INVENTION

1. Field of the Invention

The present invention relates to a CMOS image sensor, and more particularly, to a method for fabricating a CMOS image sensor to improve a charge capacity in a photodiode.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor.

In case of the CCD, respective metal-oxide-silicon MOS capacitors are positioned adjacently, wherein electric charge carriers are stored in and transferred to the capacitors. Meanwhile, the CMOS image sensor adopts the CMOS technology of using a control circuit and a signal processing circuit as the peripheral circuit. The CMOS image sensor uses the switching method of sequentially detecting output signals by forming the predetermined number of MOS transistors in correspondence with the number of pixels.

The CCD has the high power consumption and the complicated mask process. Also, it is impossible to provide the signal processing circuit inside the CCD chip, whereby it cannot be formed in one chip. In order to overcome these problems, the sub-micron CMOS fabrication technology has been researched and developed.

The CMOS image sensor may have various types of pixel. Generally, the CMOS image sensor may have a pixel of 3-T (3-Transistor) structure or a pixel of 4-T (4-Transistor) structure. At this time, the pixel of 3-T structure is comprised of one photodiode and three transistors, and the pixel of 4-T structure is comprised of one photodiode and four transistors.

FIG. 1 is a circuit diagram of showing a unit pixel of a 4-T CMOS image sensor according to the related art. As shown in FIG. 1, a unit pixel of a 4-T CMOS image sensor according to the related art is comprised of one photodiode PD and four NMOS transistors Tx, Rx, Dx and Sx. In this case, the photodiode PD functions as the photo-sensing means. The four transistors are formed of a transfer transistor Tx, a reset transistor Rx, a drive transistor Dx and a select transistor Sx. At this time, the transfer transistor Tx transfers optical charges generated in the photodiode PD to a floating sensing node. The reset transistor Rx discharges the optical charges stored in the floating sensing node to detect signals. Also, the drive transistor Dx functions as a source follower, and the select transistor Sx is provided for switching and addressing the optical charges.

In addition, a DC transistor is a load transistor. That is, the DC transistor has a gate electrode, wherein a constant voltage is applied to the gate electrode. Thus, a constant current flows through the DC transistor. Also, '$V_{DD}$' is a drive power voltage, '$V_{SS}$' is a ground voltage, and 'Output' is an output voltage of a unit pixel.

In the aforementioned CMOS image sensor, the structure of the photodiode PD is very important to the charge capacity.

FIG. 2 shows an operation of a photodiode in a CMOS image sensor according to the related art. In FIG. 2, the reference number '1' indicates a semiconductor substrate, the reference number '2' indicates an STI (Shallow Trench Isolation) layer for isolation of device, the reference number '3' indicates a photodiode ion-implantation diffusion layer, the reference number '4' indicates a depletion layer generated by applying a reverse bias to the photodiode ion-implantation diffusion layer 3, and the reference number '5' indicates an incident light.

In the aforementioned photodiode, the depletion layer 4 is formed, as shown in FIG. 2, when applying the reverse bias to the photodiode ion-implantation diffusion layer 3.

As the light 5 is incident on the depletion layer 4, electron-hole pairs EHP are generated. As shown in the drawings, the holes are discharged to the semiconductor substrate 1, and only the electrons are accumulated to the depletion layer 4, whereby the photodiode operates. Accordingly, as the electron-hole pairs EHP increase in the depletion layer 4, the characteristics of the photodiode improves.

According as the reverse bias is applied to the photodiode ion-implantation diffusion layer 3, the depletion layer 4 has the large inner space in the initial stage. As the electron-hole pairs EHP increase, the holes are discharged to the semiconductor substrate 1, and the electrons are accumulated in the depletion layer 4. With the increase of the accumulated electrons, the inner space of the depletion layer 4 decreases. Thus, the inner space of the depletion layer 4 is decreased little by little so that the inner space of the depletion layer 4 corresponds to the profile of the photodiode ion-implantation diffusion layer 3 before applying the reverse bias.

Accordingly, in case the area of the photodiode ion-implantation diffusion layer 3 is small, the charge capacity is lowered. In other words, if the area of the photodiode ion-implantation diffusion layer 3 is large, the charge capacity is increased.

Hereinafter, a method for fabricating a photodiode of a CMOS image sensor according to the related art will be described with reference to the accompanying drawings.

FIG. 3A and FIG. 3B are cross sectional views of the process for fabricating a photodiode of a CMOS image sensor according to the related art.

In case of a photodiode of a CMOS image sensor according to the related art, as shown in FIG. 3A, an STI (Shallow Trench Isolation) layer 12 is formed in a semiconductor substrate 11. Then, impurity ions for formation of a photodiode are implanted to the semiconductor substrate 11, thereby forming an ion-implantation layer 13.

Subsequently, as shown in FIG. 3B, a thermal process is performed to the ion-implantation layer 13. As a result, a photodiode ion-implantation diffusion layer 14 is formed by diffusing the ions of the ion-implantation layer 13.

The ions of the ion-implantation layer 13, adjacent to the interface with the STI layer 12, may be diffused to the interface between the semiconductor substrate 11 and the STI layer 12 by the thermal process. Also, the ions of the ion-implantation layer 13 may be bonded to the ions of a field channel stop ion-implantation layer (which has the opposite conductive type to the impurity ion for the photodiode), whereby the ions of the ion-implantation layer 13 are extinct. Accordingly, the density in the photodiode ion-implantation diffusion layer 14 adjacent to the STI layer 12 is lower than the density in the central portion of the photodiode ion-implantation diffusion layer 14.

Accordingly, as shown in FIG. 3B, the predetermined portion of the photodiode ion-implantation diffusion layer 14 being adjacent to the STI layer 12 is thinner than the central portion of the photodiode ion-implantation diffusion layer 14.

As explained above, the charge capacity of the photodiode is in proportion to the area of the photodiode ion-implantation diffusion layer 14. In the predetermined portion of the photodiode ion-implantation diffusion layer 14 being adjacent to the STI layer 12, the charge capacity of the photodiode is lowered in proportion to the decreased area of the photodiode ion-implantation diffusion layer 14.

In the dark surrounding of low luminous intensity, when the amount of incident light is small, the small area of the photodiode ion-implantation diffusion layer 14 doesn't cause any problem. However, in the bright surroundings of high luminous intensity, when the amount of incident light is large, the sensing capacity of the CMOS image sensor is lowered since it is impossible to completely accumulate to the electrons changed by the incident light.

SUMMARY OF THE INVENTION

Accordingly, the present invention is directed to a method for fabricating a photodiode of a CMOS image sensor that substantially obviates one or more problems due to limitations and disadvantages of the related art.

An object of the present invention is to provide a method for fabricating a photodiode of a CMOS image sensor to improve a charge accumulation capacity in the photodiode.

Another object of the present invention is to provide a method for fabricating a photodiode of a CMOS image sensor to improve a sensing capacity of the CMOS image sensor in the bright surroundings.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a photodiode of a CMOS image sensor includes the steps of defining a semiconductor substrate as an active area and a field area by forming an STI layer; firstly implanting impurity ions for formation of the photodiode to the semiconductor substrate of the active area; secondarily implanting impurity ions for formation of the photodiode to the semiconductor substrate being adjacent to the STI layer; and forming a photodiode ion-implantation diffusion layer by diffusing the implanted impurity ions with a thermal process.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a photodiode of a CMOS image sensor according to the present invention will be described with reference to the accompanying drawings.

Figure 1:
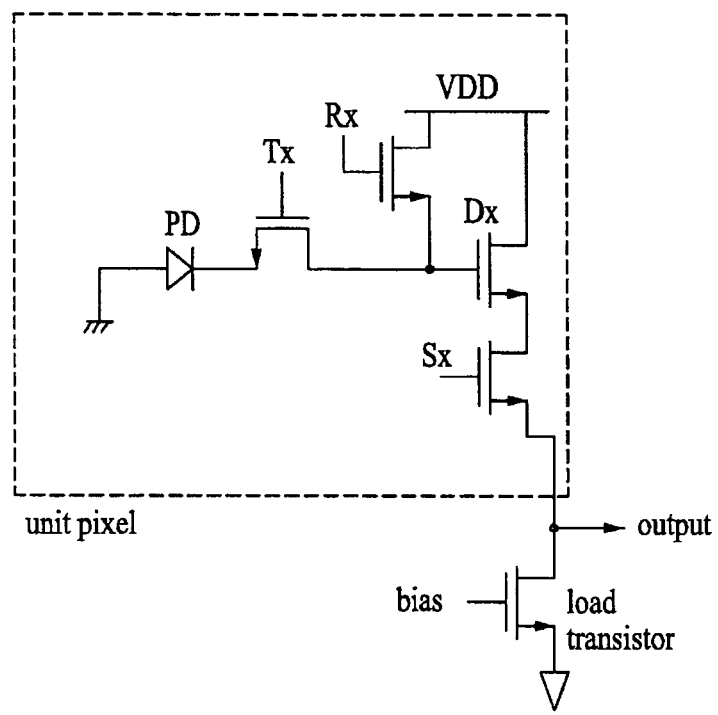
FIG. 1 is a circuit diagram of showing a unit pixel of a 4-T CMOS image sensor according to the related art.
Figure 2:
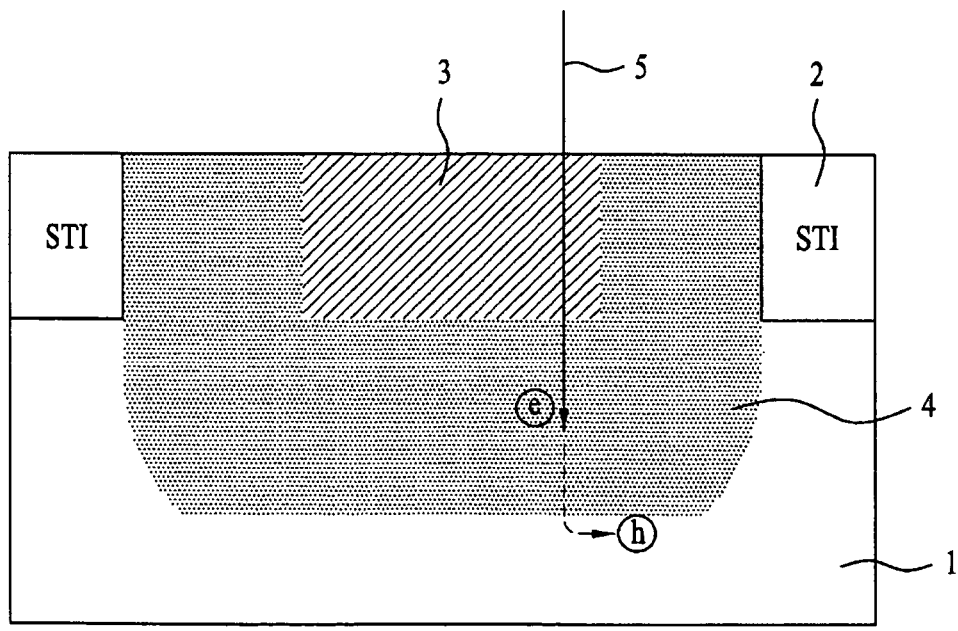
FIG. 2 shows an operation of a photodiode in a CMOS image sensor according to the present invention.
Figure 3A:
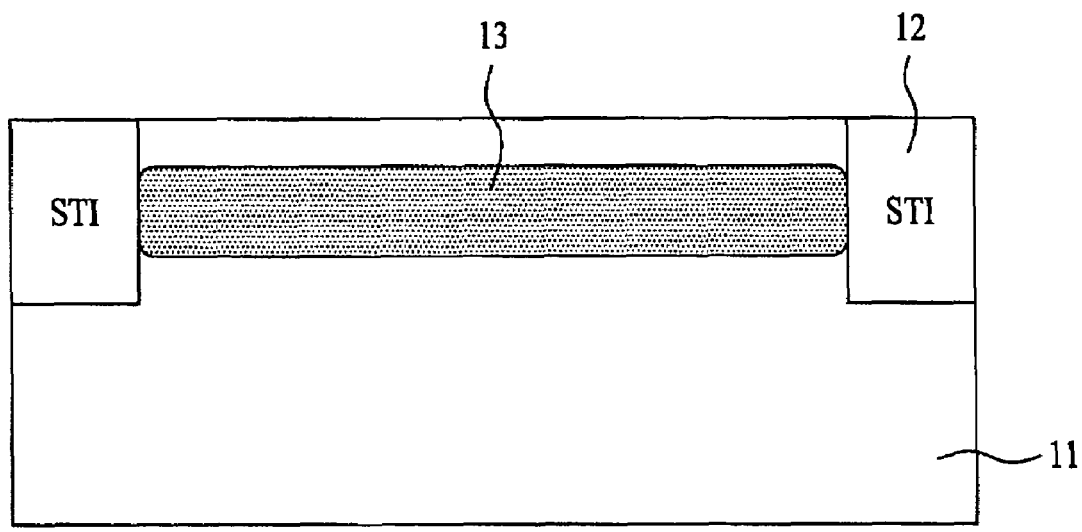
FIG. 3A and FIG. 3B are cross sectional views of the process for fabricating a photodiode according to the related art.
Figure 3B:
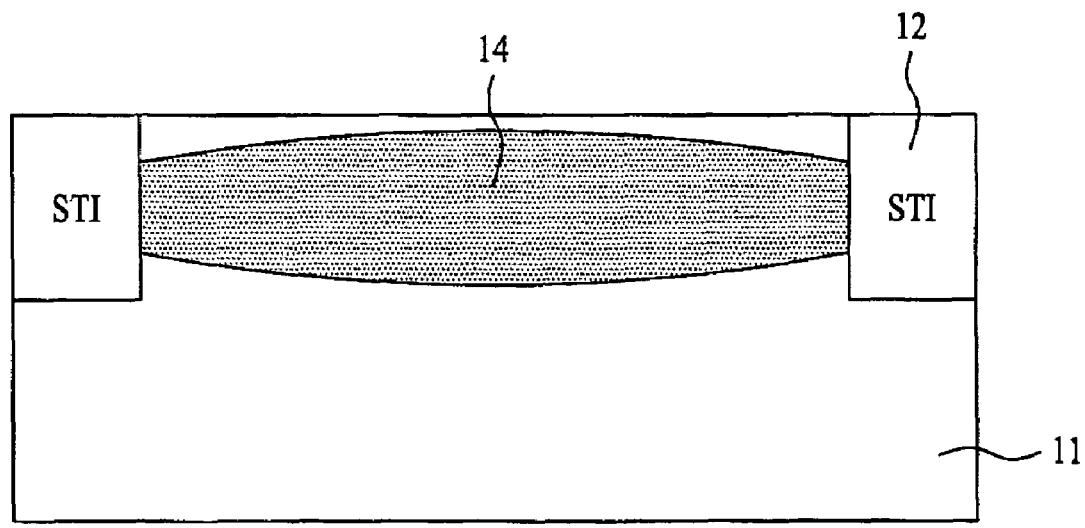
Figure 4A:
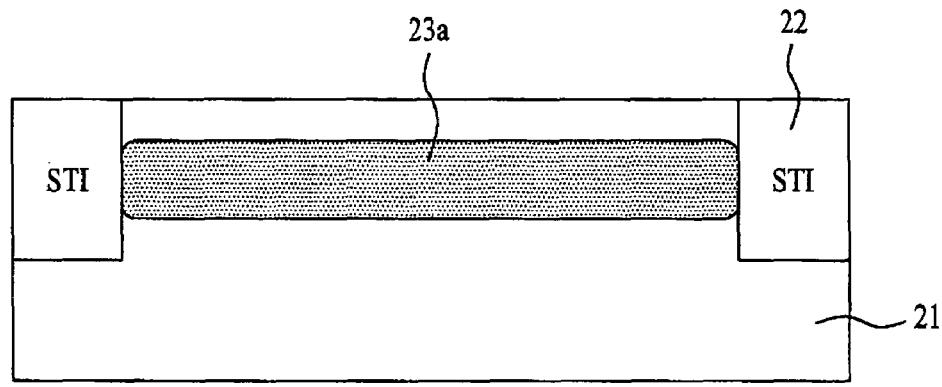
FIG. 4A to FIG. 4C are cross sectional views of the process for fabricating a photodiode according to the preferred embodiment of the present invention.
Figure 4B:
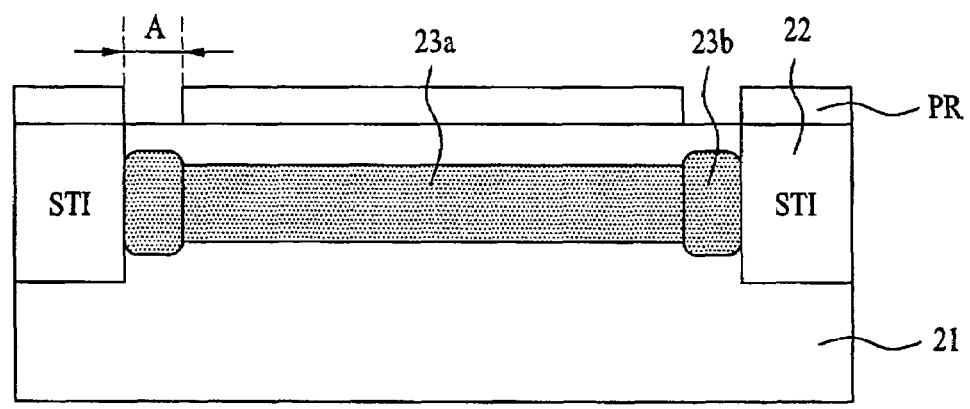
Figure 4C:
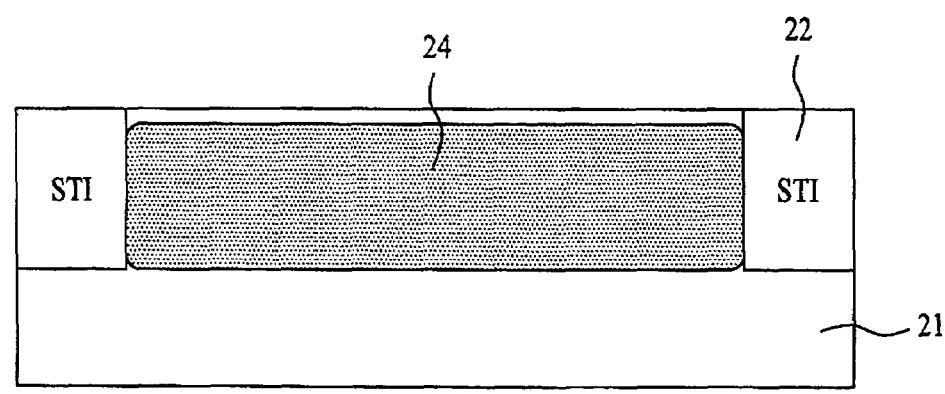

FIG. 4A to FIG. 4C are cross sectional views of the process for fabricating a photodiode of a CMOS image sensor according to the present invention.

As shown in FIG. 4A, an STI layer 22 is formed in a semiconductor substrate 21 by a trench isolation technology. As a result, the semiconductor substrate 21 is divided into an active area and a field area.

After that, impurity ions for formation of a photodiode are firstly implanted to the semiconductor substrate 21 of the active area in correspondence with the portion for the photodiode, thereby forming an ion-implantation layer 23.

Subsequently, a photoresist PR is coated on an entire surface of the semiconductor substrate 21. Then, as shown in FIG. 4B, the photoresist PR is patterned by exposure and development, so that the predetermined portion of the semiconductor substrate of the active area 21 being adjacent to the STI layer 22 is exposed. At this time, the predetermined portion of the semiconductor substrate 21 is exposed at a width (A) below 0.5 µm by patterning the photoresist PR.

In the aforementioned drawings, the photoresist PR is patterned not to expose the STI layer 22. However, the STI layer 22 may be exposed in due consideration of the process margin.

To compensate for the loss of the impurity ions for formation of the photodiode in the portion adjacent to the STI layer 22, impurity ions for formation of the photodiode are secondarily implanted to the semiconductor substrate 21 in state of using the patterned photoresist PR as a mask. As a result, the ion density in the predetermined portion of the ion-implantation layer 23 being adjacent to the STI layer 22 increases, so that it is possible to increase the size of the ion-implantation layer 23 being adjacent to the STI layer 22.

At this time, the ion-implantation energy in the process for firstly implanting the impurity ions is identical to the ion-implantation energy in the process for secondarily implanting the impurity ions.

Next, the photoresist PR is removed.

Subsequently, as shown in FIG. 4C, a thermal process is performed to the ion-implantation layer 23, whereby the ions of the ion-implantation layer 23 are diffused, thereby forming a photodiode ion-implantation diffusion layer 24.

The ions of the ion-implantation layer 23 being adjacent to the interface with the STI layer 22 are partially diffused to the interface between the semiconductor substrate 21 and the STI layer 22 by the thermal process. Also, the ions of the ion-implantation layer 23 may be bonded to ions of a field channel stop ion-implantation layer formed below the STI layer 22 to enhance the isolation (which has the opposite conductive type to the impurity ion for the photodiode), whereby the ions of the ion-implantation layer 13 are extinct. However, the second photodiode ion-implantation process compensates for the loss of ions. Thus, even though the ions are lost in the thermal process, the density in the predetermined portion of the photodiode ion-implantation diffusion layer 24 being adjacent to the STI layer 22 is very similar to the density in the central portion of the photodiode ion-implantation diffusion layer 24.

Even in case of the portion of the photodiode ion-implantation diffusion layer 24 being adjacent to the STI layer 22, the area is not decreased. Thus, it is possible to increase the charge capacity in the photodiode ion-implantation diffusion layer 24.

As mentioned above, the method for fabricating the photodiode of the CMOS image sensor according to the present invention has the following advantages.

In the method for fabricating the photodiode of the CMOS image sensor according to the present invention, the photodiode ion implantation process is additionally performed to the semiconductor substrate being adjacent to the STI layer. Accordingly, even if the ions are lost in the portion being adjacent to the STI layer during the thermal process, the additional photodiode ion implantation process compensates for the loss of ions. Thus, it is possible to prevent the thickness of the photodiode ion-implantation diffusion layer in the portion adjacent to the STI layer from being decreased, thereby improving the charge capacity of the CMOS image sensor.

Accordingly, even in the bright surrounding of high luminous intensity, the CMOS image sensor has the great sensing capacity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a photodiode of a CMOS image sensor comprising:
    defining an active area and a field area in a semiconductor substrate by forming an STI layer;
    implanting first impurity ions to form a photodiode ion-implantation layer in the active area;
    implanting second impurity ions in regions of the photodiode ion-implantation layer adjacent to sidewalls of the STI layer, the second impurity ions having a conductivity type identical to the first impurity ions; and
    forming a single photodiode ion-implantation diffusion layer by diffusing the first and second impurity ions with a thermal process.

2. The method of claim 1, wherein an energy in the process for implanting the first impurity ions is identical to an energy in the process for implanting the second impurity ions.

3. The method of claim 1, wherein the process for implanting the second impurity ions includes:
    forming a photoresist exposing a predetermined portion of the active area adjacent to the sidewalls of the STI layer; and
    implanting impurity ions into the semiconductor substrate using the photoresist as a mask.

4. The method of claim 3, wherein the predetermined portion of the semiconductor substrate has a width below 0.5 μm.

5. The method of claim 3, wherein the photoresist covers a portion of the STI layer.

6. The method of claim 1, wherein implanting the second impurity ions increases an ion density in the regions of the photodiode ion-implantation layer adjacent to the STI layer.

7. The method of claim 1, wherein diffusing the first and second impurity ions bonds the second impurity ions to a field channel stop ion-implantation layer.

8. The method of claim 7, wherein the field channel stop ion-implantation layer is below the STI layer.

9. The method of claim 1, wherein diffusing the first and second impurity ions provides an ion density in the region of the photodiode ion-implantation diffusion layer adjacent to the STI layer that is similar to an ion density in a central portion of the photodiode ion-implantation diffusion layer.

* * * * *